United States Patent [19]

Terminiello et al.

[11] Patent Number: 5,117,189

[45] Date of Patent: May 26, 1992

[54] AUTOMATIC TESTING APPARATUS FOR ELECTRICAL SWITCHES

[75] Inventors: Michael A. Terminiello, Cheshire; Marc P. Asselin, Beacon Falls; Joseph P. Fowler, Newtown; Lawrence M. Hauser, Waterbury; Raymond E. Sansom, New Milford, all of Conn.

[73] Assignee: Eaton Corporation, Cleveland, Ohio

[21] Appl. No.: 482,604

[22] Filed: Feb. 21, 1990

[51] Int. Cl.⁵ ............................................. G01R 31/02
[52] U.S. Cl. ..................................... 324/415; 324/423
[58] Field of Search .................... 324/415, 418, 423; 340/644; 377/20

[56] References Cited

U.S. PATENT DOCUMENTS

| | | | |
|---|---|---|---|
| 3,241,063 | 3/1966 | Beattie et al. | 324/423 X |
| 3,803,480 | 4/1974 | Goldbach | 324/423 |
| 3,823,366 | 7/1974 | Fabry | 324/423 |
| 3,988,664 | 10/1976 | Beery et al. | 324/423 |
| 4,504,789 | 3/1985 | Carr et al. | 324/423 X |

Primary Examiner—Jack B. Harvey
Attorney, Agent, or Firm—C. H. Grace

[57] ABSTRACT

A computer-controlled apparatus (1) for electrical testing of the make-and-break characteristics of electrical switches (15), including characteristics when the switches are actuated very slowly. The apparatus automatically feeds the switches into a test position (16), "breaks them in" by cycling them through many operations, and tests their switching parameters. The amount of hysteresis (54) between a switch actuator's (38) positions at actuation (30) and deactuation (56) is a criterion for sorting the switches. Switches are automatically classified and marked (14) according to their tested characteristics, and sorted into bins (28, 29). Any undesirable electrical "deadbreak" (an excessive transfer delay) during the operation of a double-throw switch's contacts is detectable by both a Timer Method and a Limit Switch Method, and faulty switches are reliably rejected. The apparatus increases accuracy in the testing of switches and reduces human errors such as those caused by fatigue.

1 Claim, 8 Drawing Sheets

AUTOMATIC TESTING APPARATUS FOR ELECTRICAL SWITCHES

FIELD AND BACKGROUND

The invention relates to testing of electrical switches, including their make-and-break behavior when the switches are actuated extremely slowly. An example is a switch that is actuated in response to an aneroid transducer that senses gradual changes of altitude of an aircraft. Environmental control systems represent another field of use in which very slow actuation of switches occurs. The electrical tests include the detection of a type of fault that is peculiar to switches when they are actuated very slowly. The tests classify, mark and sort the switches into categories according to operating characteristics.

Many methods are presently used for testing electrical switches to determine their hysteresis and other characteristics including the time of the switch contacts's breaking, transferring, and remaking. To provide examples of some of the limitations that are overcome by the present invention, the following three types of prior methods and apparatus are briefly described.

One prior method is simply to mount a switch on a test bed having a large-drum micrometer as the actuating device, manually advance the micrometer, and observe the switching of the contacts by means of a light bulb connected with the switch. The switch plunger's positions at the circuit's make and break times are known from the positions of the micrometer.

One of its problems is that the manually-operated micrometer can accidentally drive the switch beyond its limits of travel, causing immediate or latent switch failure. Also, not enough information is provided about the contact change-over time of a double-throw switch, which is the time between opening of one contact and closing of another.

Moreover, the operator may fail to detect a switch fault known as a "deadbreak", which is an unwanted pause period during snapover of the switch. Deadbreak is a contact hangup in which there is force equilibrium (zero net force) on the movable element without contact pressure, and the contacts are hung up temporarily as a movable contact separates mechanically from one stationary contact and goes to another.

A second prior apparatus is an electro-mechanical device as described above, but in which the contacts are coupled to a linear variable-differential transformer device (LVDT). The actuating and response signals of the switch are recorded on an ink trace chart. The operator manually measures the length (duration) of the ink trace with a card (FIG. 6) having a graduated scale showing switch categories, and assigns the switch to an indicated category. The results are often inaccurate because of the measurement method and human error.

A third known type of equipment, which is used and offered by one of the switch manufacturers, automatically measures switch actuation and de-actuation forces and provides a thermal printout of the results. This machine does not, however, fulfill all of the needs of certain switch users. Although information is provided regarding electrical contact changeover, its emphasis is on operating forces during the contacts' make and break intervals. It does not provide electrical deadbreak information to the degree required by many industrial users of the switches, such as those who use the switches in situations in which they are actuated very slowly.

SUMMARY

The invention is a computer-controlled switch-testing machine that automatically feeds the switches into a test position, "breaks them in" by cycling them through many operations, tests their electrical make-and-break characteristics, classifies them into categories, marks them, and sorts them into bins based on the test results.

One object of the invention is to provide apparatus to break in, accurately test, classify, mark, and sort electrical switches for which the electrical make and break characteristics are of interest.

Another object is to provide apparatus to test and classify electrical switches in which the amount of hysteresis (i.e., the difference between positions of the plunger of a switch upon actuation and de-actuation), is a criterion for sorting the switches into different categories, and the measurement is made with extreme accuracy.

Another object is to provide automatic apparatus to test double-throw electrical switches in which an electrical deadbreak during actuation (i.e., an inordinately long time delay between breaking of one contact circuit and making of another contact circuit) is detected.

Another object is to provide automatic apparatus to detect electrical deadbreaks redundantly by two different methods for increased reliability.

Another object is to identify defective switches automatically.

Another object is automatically to mark switches according to their tested characteristics, involving positioning of a marking device by the use of a "home" position technique that facilitates driving the marking device to the correct position.

Another object is to provide apparatus to increase accuracy and productivity in the testing of switches and to reduce errors and other effects of human fatigue.

The apparatus herein was invented and developed because it was commercially needed and was not known or available.

DESCRIPTION OF A PREFERRED EMBODIMENT

Overview of Apparatus

The switch-testing apparatus 1 includes a frame 2 that is suitable for placement on a bench 3, as shown in FIG.

1. It tests switches that an operator has pre-loaded into a vertical magazine 4.

Figure 1:
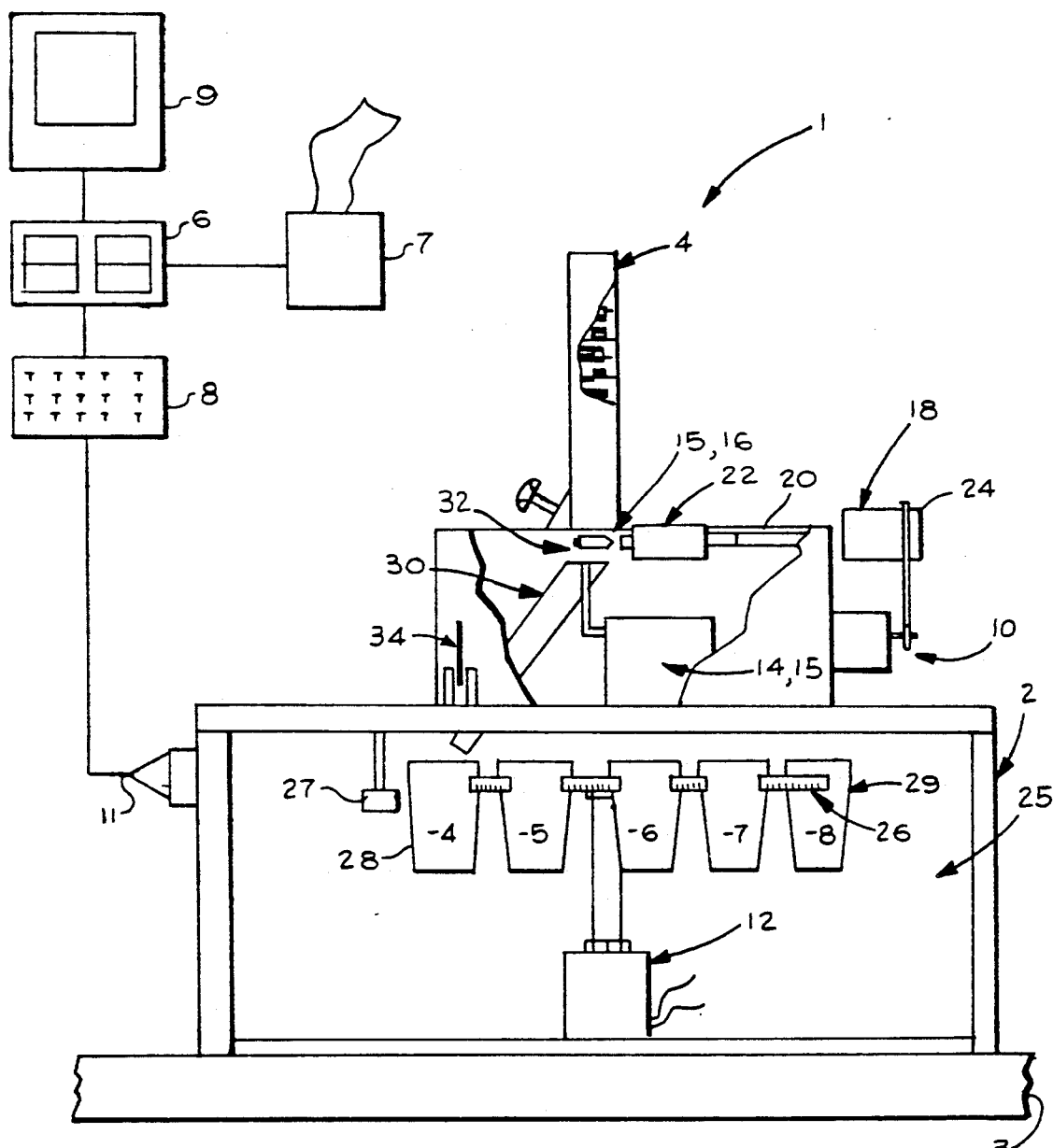
FIG. 1 is a simplified mechanical diagram showing a cutaway side view of the invented apparatus.
Figure 4:
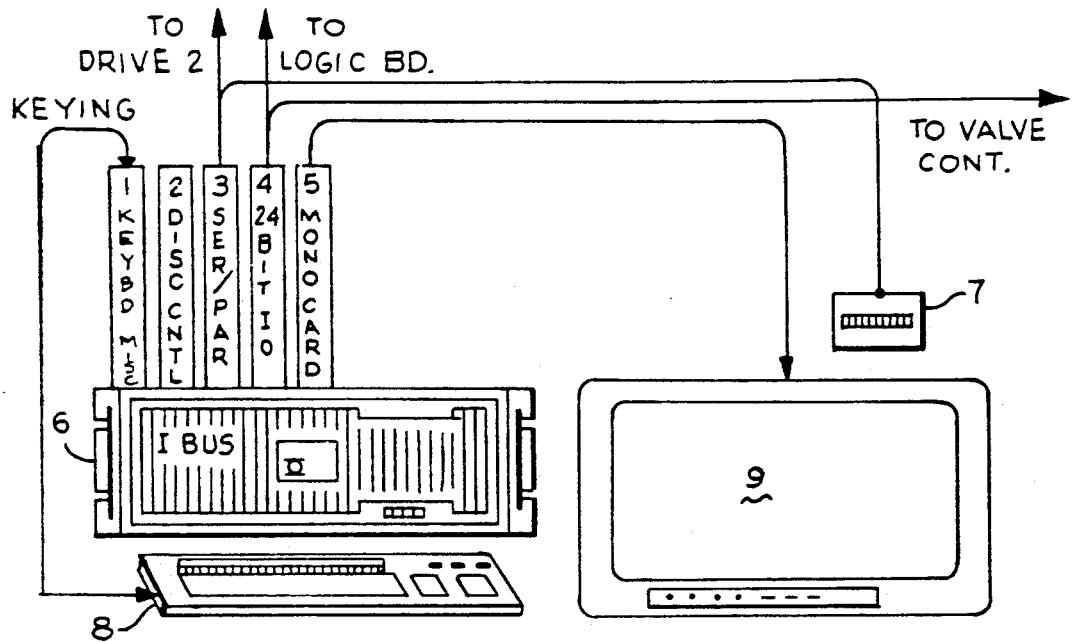
FIG. 4 is a connection diagram for a computer, its keyboard, and its display unit.

The apparatus also includes a computer 6, which is connected with equipment on the frame 2 by conductors 11 (FIG. 1). It also has a computer keyboard 8, a data printer 7 and a visual display monitor 9. FIG. 4 also shows the computer components.

Preparations for Testing of Switches

Different types and sizes of switches are testable, but all of the switches in the magazine 4 at one time are of the same type. To test a batch of switches the operator starts the machine 1 and selects a part number identifying the type of switch to be tested from a menu displayed on CRT 9 via the keyboard 8. If the identified type of switch is one for which the computer 6 has been pre-programmed, the computer accepts and acknowledges the selection.

In the computer's database several interchangeable parts are specified for each type of switch. They are the pogos (variable-length spring-loaded electrical contacts), the switch shuttle (carrier), the magazine (switch holder) 4, switch clamp, and rubber marking stamp. The CRT 9 prompts the operator to insert the proper interchangeable parts or to verify that they are already in place. A software program in the computer 6 then selects previously stored programs appropriate for the type of switch that was specified, for controlling stepper motors 10 and 12, and a program for controlling a marking device 14.

Start of Switch-Testing Operation

The operator presses a "start test" key on the keyboard 8, after which the computer 6 acknowledges the presence of a loaded magazine 4.

For clarity a flow chart of the operation is described in a separate section below.

Before the machine shuttles the first switch into a test position 16 (near the bottom of the magazine 4), it "homes" a micrometer 18 to a predetermined position to verify that a previous switch isn't caught in the mechanism and that the test area is clear. The home sensor is an optical sensor having a slotted optical switch and a small flag on the end of the micrometer.

A first switch 15 to be tested is transported automatically to the test position 16. A shuttle picks up the switch and slides it into position 16, which is in front of the micrometer head. A clamp (not shown) engages (from the top) two mounting holes in the switch 15. It firmly holds the mounting holes on pins during the tests; measurements to 50 millionths of an inch are to be made, so the switch must not move about.

An electrical contact block (not shown) also moves into position automatically, and connects electrically to terminals of the switch. The contacts of the block are referred to as pogo contacts because they are spring-loaded so as to have variable length and still be capable of applying contact pressure to the switch terminals.

Continuity Test

In the example being described the switches are of a single-pole double-throw type. Before starting a break-in routine the machine 1 checks the switch's normally closed contacts 36 for continuity (FIG. 2), via the pogo contacts. Common causes of failure of continuity are a jam in the loading mechanism, faulty performance of the pogos, and a defective switch whose contacts do not close or perhaps because of interfering foreign matter.

If the normally closed circuit is not conductive the test of that switch is discontinued; the operator is informed by an audible beep and a visual prompt on the CRT 9. The machine can often ascertain what caused the error, and if the cause is known the computer screen shows it. If the problem is something that merely requires operator intervention to clear it, such as a jam, the test can continue after it is cleared. The machine guides the operator by visual prompts through clearing of a jam and resumption of operation.

Break-In Test

A break-in test starts after the switch has been successfully loaded in place, the normally closed contacts 36 have been found to have continuity, and the micrometer drive 18 has been homed. The computer 6 commands the stepper motor 10 to perform a "break-in" procedure, of rapidly repeated actuations of the switch.

The stepper motor 10 rotates the drive screw of the micrometer 18 clockwise and counterclockwise for many revolutions. A non-rotating rod 20 of the micrometer 18 engages a plunger (actuator) 38 of the switch 15. As the rod 20 of the micrometer 18 moves inward it actuates the switch 15. When the rod 20 reaches a place 39 at which the normally closed (NC) switch contacts open (FIG. 3), it stops, then overtravels a predetermined amount before reversing.

Upon coming back out it overtravels enough to completely operate any type of switch that is expected to be tested. The micrometer drive does not go all the way back to its home position 46, however; it travels only far enough (48) to ensure a full cycle of the switch, then starts inward travel again. The rod 20 executes 20 round-trip inward and outward cycles of each switch. For break-in purposes the micrometer 18 is driven at about 1.25 revolutions per second, which moves the actuator 38 about 31.25 thousandths of an inch of linear travel per second.

The switch contacts 36, 50, 52 of the switch under test (FIG. 2) are used to provide position-of-actuation information; during the break-in operation the switch contacts are used for signifying that an inward point 39 and an outward point 56 have been reached. As the micrometer rod 20 comes inward and actuates the switch 15 which (indirectly) opens a circuit to the stepper motor 10 that drives the micrometer head, to stop the motor 10.

Figures 2, 3:
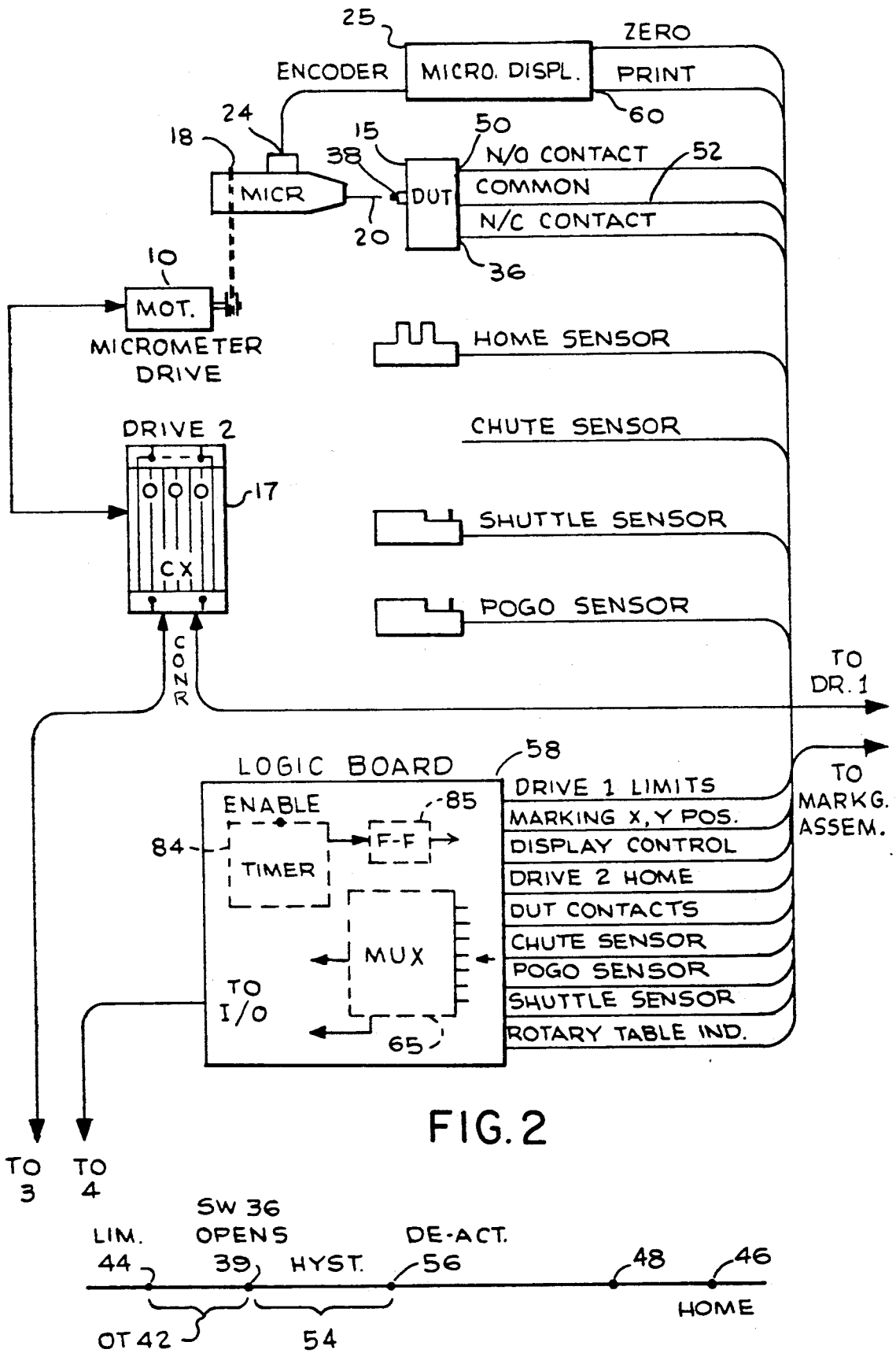
FIG. 2 is a simplified schematic block diagram of a portion of the test apparatus and the logic-board electrical connections of the invention.
FIG. 3 is a diagram of positions of a switch's actuator showing its actuation positions and overtravel limits (not to scale).

As the switch's normally closed contact 36 opens, its movable contact arm (armature) 52 swings over toward closing of a normally open (NO) contact 50. The computer is informed that the normally closed contact opens (FIG. 2).

The motor 10 stops when the normally closed contact 36 opens, then the computer 6 "gets around" the stopping point 39 (FIG. 3) by an overriding command. The motor is restarted to continue for five thousandths of an inch of overtravel 42 in the inward direction. Excessive overtravel could push the switch out of the mechanism, crush it, or do other damage.

Hysteresis Measurement

After completing the break-in routine of 20 cycles (or some other number of cycles predetermined in the computer program), the computer 6 reduces the speed of the stepper motor 10 to simulate slow-operation conditions under which the switch is expected to be used later. For hysteresis measurements, the motor operates at 0.11 rps. In the micrometer 18 of the embodiment being described, which advances the rod, the resulting rate of plunger movement is 0.69 thousands of an inch per second.

This part of the testing program measures the switch's hysteresis 54 from on to off, which is the difference in actuator positions between switch actuation 39 (in which actuator motion is inward) and deactuation 56 (outward). See FIG. 3.

To perform the hysteresis test the micrometer rod 20 first moves the switch plunger 38 inward. The system senses the electrical operation of the normally closed contacts 36 and the normally open contacts 50 of the switch under test so it can record the readings of the micrometer encoder 24 upon actuation 39 of the switch during actuator inward travel (with micrometer rod 20 moving toward the switch), and deactuation 56 during actuator outward travel. To improve accuracy the switch's output signals are buffered by circuits on a logic board 58 (FIG. 2). (The output signals from the micrometer head are also buffered before use.)

The normally closed contact 36 opens, which causes stopping of the motor 10.

Information as to the instantaneous position of the rod 20 of the micrometer 18 is available in the computer 6 because the computer provides commands for movement to the stepper motor 10, which drives the micrometer, and the micrometer includes a very precise position-feedback resolver 24. This encoder portion 24 of the micrometer 18 is built right into the micrometer head. An external digital light-emitting diode (LED) display 25' (FIG. 2) is connected to the computer. The computer commands the LED display 25' to report out its position.

Although a position encoder 24 is integrally mounted on micrometer 18 in the preferred embodiment, on some other machines other types of location-sensing devices may be used if desired. An example is a linear variable differential transformer, LVDT 22, which can measure the position of the micrometer rod 20 (FIG. 1).

The system doesn't wait for the computer 6 to recognize that there was a switch contact change (e.g., opening of the NC contacts 36) and then ask the micrometer's encoder 24 for position information. By that time the micrometer rod 20 would have moved an additional amount, which could introduce error into the position measurement. Instead, the switch actuation signal from the buffer of contacts 36 is sent simultaneously to the micrometer's LED display 25' and to the computer 6. The LED display has a "print input" terminal 60 that is used for receiving the buffered switch signal (FIG. 2) that indicates that the switch contacts 36 have been actuated. When a switch actuation signal is received at the "print input" terminal 60 the encoder 24 promptly takes a reading, to seize and register the correct position data.

Following receipt by the computer of information that the switch contacts 36 have been actuated, the computer sends a computer-originated signal to the micrometer 18 requesting position data from the micrometer's encoder 24. The previously held position data is transmitted from the encoder 24 to the computer 6 on a leisurely schedule. This enables the data-capturing to be quicker and therefore more accurate. The computer can use the position information whenever it is convenient to do so (which is within a second), with no reduction of accuracy due to normal delay in the computer.

Continuing with the sequence of hysteresis-testing operations, the motor 10 is then reversed and the plunger is moved outward. This time the system monitors the normally open contacts 50 (now closed), and measures the position of the plunger when the normally open contacts reopen. When the normally open contacts reopen the motor stops and another command is sent to the micrometer head to read the present position.

The difference between the plunger's position upon actuation and its position upon deactuation is determined by subtraction in the computer 6 to obtain a measure of the hysteresis.

At least two slow measurement runs are performed to measure the hysteresis, and their results are compared by the computer for repeatability. The number of test repetitions is programmable. If desired the hysteresis measurement can be performed up to five times to get a repeatable reading. After five unsuccessful tries the machine classifies the switch as faulty, and indicates on the screen that it is a reject. The reason for rejection (in this case nonrepeatability), is also displayed.

Because of the methods just described the hysteresis measurements are very accurate. The apparatus measures the hysteresis of switches in units of ten-thousandths of an inch.

Classifying Switches by Amount of Hysteresis

If a switch 15 passes the hysteresis repeatability test it is classified according the value of its hysteresis 54. A small database having a plurality of switch hysteresis category numbers was previously entered into the computer. The program's software compares the hysteresis 54 with its stored table of limits for hysteresis categories and selects the correct category number for the switch being tested.

If the measured hysteresis 54 is below the lowest permissible value or above the highest permissible value, the switch is classified as faulty and rejected.

Automatic Marking of Switches

Figure 6:
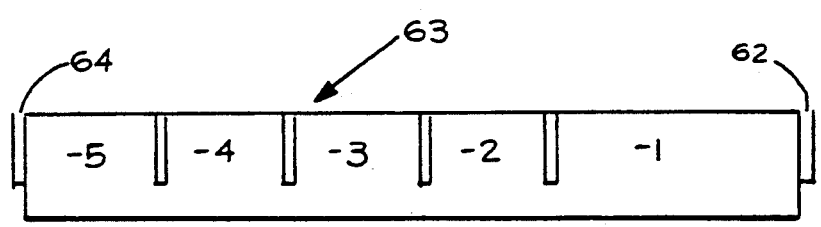
FIG. 6 is a scale illustrating categories for classification of switches according to their hysteresis using prior apparatus.

The marking device 14 automatically rubber-stamps the body of the tested switch 15 with a character in ink to show a category number (ref 63, FIG. 6) corresponding to the hysteresis 54 that was measured (FIG. 3). The marking device is fastened to a movable table (transport means) 15, and the character mark to be applied is selected by moving the marking device as a whole to a predetermined position relative to the switch. A multistage infrared photocell system 34 positions the marking device 14, FIGS. 1 and 5. After the switch is marked, the holding device and the electrical contact block at the test position 16 automatically retract from the tested switch 15, and the switch is ejected. Details are as follows.

Figure 5:
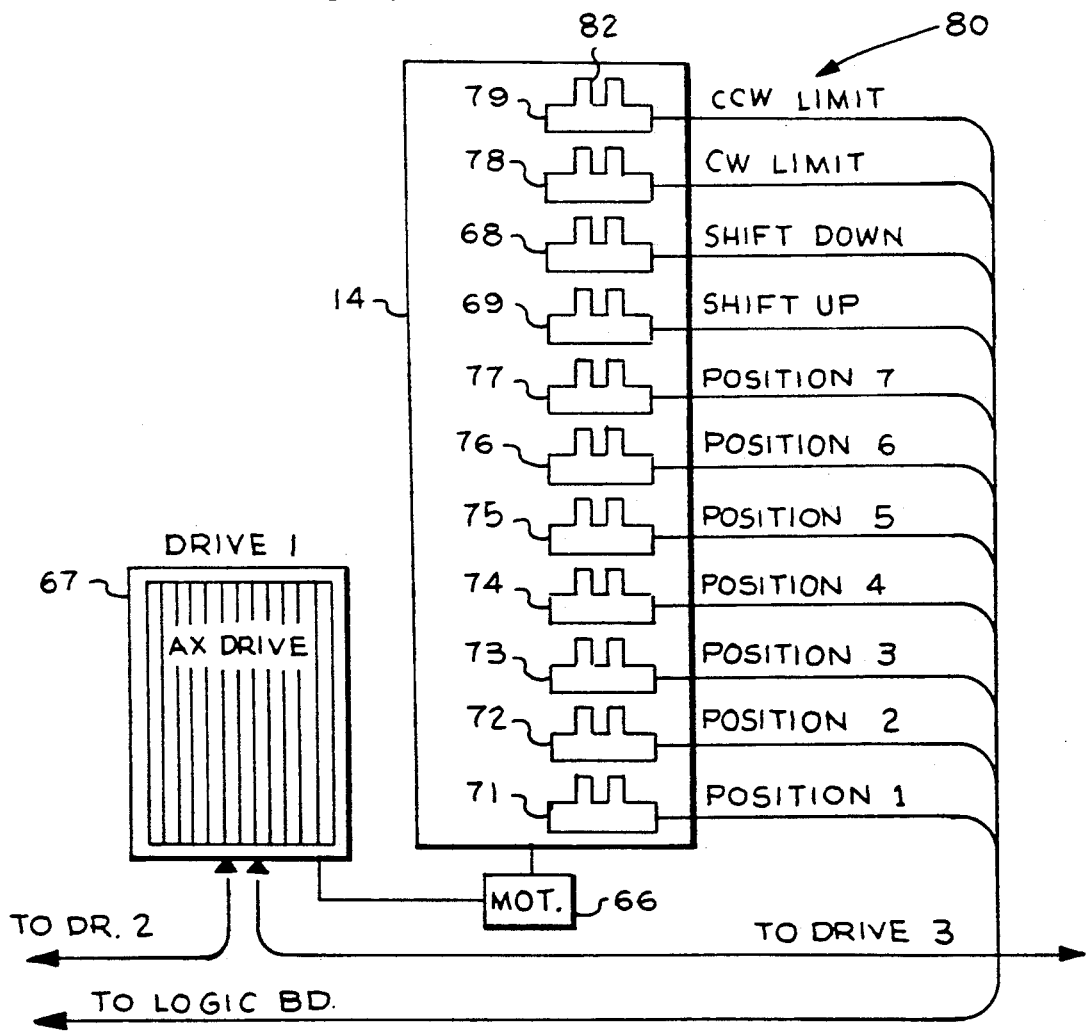
FIG. 5 is an electrical connection diagram for a product-marking device in the switch test apparatus.

The marking device 14 is movable on a two-coordinate system having seven horizontal positions and two vertical positions. It is positioned vertically to a selected one of the two rows of characters by a pneumatic actuator, not shown. The double-acting vertical pneumatic actuator is pressurized when it is commanded to move the marker up and depressurized to move it down. The vertical position of the marking device is sensed by two slotted optical switches 68 and 69, one for the down position and one for the up position (FIG. 5). They verify that the marker is in the intended position.

The slotted optical switches, which are commercially available from TRW Corporation as their Model No.

OPB980T55, are used to sense vertical and horizontal positions of the marking device, and other devices.

Horizontal positioning is done by means of a stepper motor 66 (driven by a drive 67, FIG. 5). The stepper motor 66 drives the marking device 14 to a target first, for relative positioning. The horizontal position sensing apparatus uses the slotted optical switches designated as 71 through 77 to control position within a few thousandths of an inch.

Other slotted optical switches 78, 79, are also provided, to serve as limit switches at opposite extreme ends of permissible travel of the movable table upon which the marking device 14 is mounted. The slotted optical switches 71 to 79 are fixedly mounted on the frame 2 of the testing apparatus. Each has a slot such as slot 82 (FIG. 5), making it U-shaped, and has a light source on one leg of the U directed toward a light-sensitive detector on the other leg.

The horizontal position-sensing apparatus includes a vane or mask fixedly attached to the movable table on which the marking device is mounted. The vane is a rectangular piece of sheet metal, having a small hole (window) of about one-tenth-inch width.

The vane that is mounted on the marker device table extends into the U slot of the optical switches. When the hole of the vane is moved to one of the optical switches 71-79, the light from the light source of that switch passes through the hole and falls upon the light sensitive detector of that optical switch. The impinging light produces an output signal from that particular optical switch. As the table and vane move each optical switch 71-79 turns on and off when the hole of the vane passes through its U slot.

The controller 67 of the motor 66 has a "homing function" capability. To use it, a home sensor, analogous to an optical slider switch, is electronically assigned to a selected "home" optical switch output, and the computer 6 instructs the positioning device 14 to go home. The marking device then moves to search for the selected position and stops there.

For example, if the marking device 14 is at its position 6 (sensor 76) and is commanded to go to position 4 (sensor 74), it does not go directly from 6 back to 4. Instead, the computer first electronically identifies position 4 as the home position, then commands the marking device to go home. To search, it always travels in the direction of increasing position numbers first.

It accomplishes this by means of the following equipment. The logic board 58 (FIG. 2) has a multiplexer 65 (which functions as a multiple-position selector switch), for designating any one of the position sensors 71 to 77 as the "home" position. The computer 6 commands the multiplexer 65 to select one of the position sensors (in this example, sensor 74 of position 4) as a destination to which the marking device 14 is to be moved. The optical sensor of position 4 is then the temporary home indicator for the motor controller 67.

The stepper motor 66 is then commanded to go home, by means of a command presented to the stepper motor's Controller 67, and motor controller 67 starts searching for home. In the example given above, in which it is starting at position 6, the marking device travels past position 7 to the maximum travel limit optical switch 79. There it reverses and starts traveling back through lower-numbered positions 7, 6, and 5. When it finally reaches position 4, which on the logic board 58 has been designated as the home position, the signal from switch 74 passes through the multiplexer 65 and the motor 66 is stopped.

If the starting position had been 2 and the home or destination position was selected to be 4, the marking device would start moving in the direction of increasing numbers as before, would pass from 2 through 3, and would recognize its home position when it arrived at 4, where it would stop.

Software in the computer 6 controls the various steps described above for positioning the marking device 14, by means of programming techniques that are known in the art.

Most movable components of the system are controlled by closed loops; sensing devices, mostly slotted optical switches of the type described above, are provided to ensure that the machine's components are where they should be. This not only prevents errors but enables the machine to diagnose its own faults. For example it knows whether the shuttle is in or out, or if it is jammed on two cylinders that actuate the pogos and move the switch into position, because position sensors indicate whether those cylinders are fully extended or not.

Automatic Sorting Into Bins

Within the frame 2 is a switch-sorting mechanism 25, including a bin-holding turntable 26 and a plurality of switch bins 28, 29, etc. (FIG. 1). Bin 28 collects all switches that were rejected for having deadbreaks; other bins such as bin 29 collect the switches having an amount of hysteresis within a particular assigned category.

If the switch-testing apparatus rejects a switch, the stepper motor 12 of the sorting system turns the turntable 26 so as to position a faulty-switch bin 28 under a discharge chute 30. The rejected switch is then ejected from the test position 16 by a mechanism at location 32 and it drops down the discharge chute 30 into the bin 28. Similarly the stepper motor 12 of the sorting system rotates the turntable 26 so as to place the bin for the appropriate hysteresis category under the discharge chute 30 in preparation for receiving an acceptable tested switch.

One slotted optical sensor 27 is provided to serve both a homing function and a counting function (FIG. 1). The bin table 26 is homed between switch tests then instructed to go to a position, for example, three light beams away. A slotted band extends from the bottom of the rotary table 26, which blocks or transmits the optical sensor's light beam as each bin position passes the optical sensor. The table 26 always turns in the same direction, and counts bin positions to the destination bin.

Deadbreaks

The testing apparatus is able to detect a type of defect known as a "deadbreak", which is an excessively long changeover time of a double-throw switch. It relates to the time between breaking of one contact and making of another, i.e., an interval of complete electrical discontinuity of the switch common contact, and that is of duration greater than a pretermined time limit. Existence of a deadbreak is a reason for rejection of a switch.

In the case of a deadbreak the common contact (transfer arm) 52 of the switch under test departs from the normally closed stationary contact 36 and moves toward the normally open contact 50, but on the way it has an abnormal delay. The cause of a deadbreak is often a weak spring. Ordinarily machine vibration eventually enables the common contact to go over to the other contact. A contact would probably not hang up forever between normally open and normally closed positions unless there were foreign material in the switch or some other fault of that type.

Vibration from the motor 10 that drives the micrometer, although it may slightly affect the duration of a deadbreak, is not great enough to make good switches look bad or vice versa. The microstepping motor drive 10 moves in increments of 1/12,800th of a revolution, so its motion is rather smooth. Also, the motor's force is transmitted to the micrometer drive through an isolating gear belt, so that very little motor vibration is conducted to the switch under test.

A deadbreak can be detected during either the break-in period or the hysteresis test period. It is less likely to become evident during the relatively high-speed break-in period, hence may not be discovered until the hysteresis measurement. Deadbreaks are being sensed simultaneously by two different methods by this circuitry, namely a Timer Method and a Limit Switch Method, now to be described.

Timer Method of Detecting Deadbreaks

The timer method rejects any switch having a transfer time greater than 20 milliseconds. It utilizes the input/output logic board 58, which includes various circuits including a counting type of electronic timer 84 (FIG. 2). Signals from contacts of the switch under test go to buffer circuits on the input/output board 58, which converts them to low-noise digital "ones" or "zeros". One use of the buffer output signals is to initiate a position reading of the micrometer head. Another purpose, which is of interest also for deadbreak testing, is to inform the timer 84 of the actuation of the contacts.

During inward travel, opening of the normally closed contact 36 starts the timer 84 and closure of the normally open contact 50 stops the timer. The timer declares a switch defective if it is permitted to count down to zero from a 20-millisecond initial resetting. Timing-out of the timer 84 sets a flipflop 85, and upon each cycle the computer checks to see whether that flipflop is set before proceeding with normal acceptable-switch tests.

The buffered signals of both the normally closed contact 36 and the normally open contact 50 of the switch under test are connected to inputs of a logic NOR gate. When either of those inputs is true, indicating that continuity exists at the contact, the output of the NOR gate is low; when neither of them is true, which occurs during both a normal transfer and a deadbreak situation, the output is high. The output signal of this NOR gate is a pulse whose length is determined by the transfer time of the switch. That pulse enables the timer 84. If it is too long, as measured by the timer 84, the switch 15 is defective because of deadbreak.

Limit Switch Method of Detecting Deadbreaks

The Limit Switch method, which is the method that detects almost all of the deadbreaks, is described here briefly to explain the concept, after which the individual steps of this test method are listed.

The switch under test (15) itself is used by the motor controller 58, etc. (FIG. 2) to sense that the actuator has traveled far enough. If the switch has a deadbreak during inward travel, the motor 10 is prevented from continuing because the motor controller doesn't receive certain expected feedback, namely a switch-closing signal of NO contacts 50, that it expects to receive upon switch actuation.

A deadbreak prevents the motor routine from continuing. In the routine testing of a good switch, opening of the normally open contact 50 of the switch under test is connected for use as the outward-travel position limit of the switch actuator 38, (i.e., it stops outward travel). (And the normally closed contact 36 is connected for use as the inward-travel position limit.) With a good switch, when the motor 10 is driving the switch actuator 38 inward and the normally closed contact 36 opens, the normally open contact 50 closes, and the motor stops. When the motor 10 is moving the switch plunger 38 outward and the normally open contact 50 reopens, the motor stops, to limit outward travel.

The switch buffer circuits described above inform the motor control circuits when the inward switch actuation travel point 39 (FIG. 3) has been reached. Overtravel occurs thereafter. After overtravel the next thing to do normally would be to reverse the motor and move the plunger 38 outward. However, if there is a deadbreak, there is no timely closing of the normally open contacts 50. The motor 10 receives a message indicating that the outward limit switch is open, so it won't operate in an outbound direction.

Normally the motor controller would instruct the motor 10 to reverse (move the plunger out) after the switch's normally closed contact 36 opens. However, the normally open contact 50 must also be closed, within a time window as explained below, before the motor will accept that instruction. The motor controller instructs the motor to move the plunger out, but the motor finds that its outward-position limit switch 50 is open, and it does not accept the instruction to move. Thus, the limit switch method of deadbreak detection is inherent in the motor controller itself In effect, the status of the normally open switch 50 is ascertained by a motor-controller continuity test after opening of the normally closed contacts 36.

If the common contact 52 finally does make contact (after a deadbreak) with the normally open stationary contact 50, for example during the inward overtravel interval of the plunger 38, it doesn't make any difference. By that time the command to the motor to start moving the plunger outward is no longer a viable pending command. It is too late; the system has already identified the switch as being defective There is an outward travel limit input on the motor controller that must be in a closed condition in order to enable outward travel. It is in an open condition immediately after the NC contacts 36 open. A time delay window of about 10 milliseconds, inherent in the computer's processing routine starts when the NC contact 36 opens. The limit input closure must occur during this window for an acceptable switch. The limit input must be closed (to a travel-enabling condition) before the time window closes, if outward travel is to be enabled. The time window terminates early enough that if there is a deadbreak, closure of the NO contacts 50 does not occur until after the window terminates. After window termination it is too late to enable outward travel even if the NO contact 50 then closes.

Thus, the motor 10 remains stopped and indicates a fault if the motor does not start moving outward following an outward movement command. It is enabled to start outward if the NO switch 50 does close before the window terminates (no deadbreak). After outward movement starts, the NO contact 50 serves also as a limit switch at the outward end of travel, as described above.

The sequence of steps involved in testing for deadbreaks by both methods is as follows:

A. The motor 10 is driving the micrometer rod 20 to move the switch's plunger 38 inward.
B. The NC contact 36 opens.
C. The motor 10 stops moving the plunger 38 inward.
D. At the same time, the 20 millisecond timer 84 starts counting down.
E. The controller overrides the travel limit signal that was initiated by the opening of the NC contacts (step C above), and commands the motor to drive the actuator farther inward a predetermined amount (about five thousandths of an inch). This is inward overtravel 42 of the plunger 38. The motor stops at the end 44 of the prescribed amount of inward overtravel.
F. At this time the computer 6 tests the flip-flop 85 which is controlled by the 20 millisecond timer 84. If the timer has timed out the switch has a deadbreak fault.
G. If the NO contact 50 fails to close the motor cannot move the actuator outward.
H. In a good switch the common contact 52 moves to the NO contact 50 promptly and produces an output signal from the corresponding buffer. That stops the 20 millisecond timer 84 before it has timed out its full 20 milliseconds. The switch under test is apparently all right from a deadbreak standpoint.
J. If the switch is a good one, with no deadbreak fault, the NO contact 50 closes before the window terminates. This allows the motor to start driving the plunger 38 outward.
K. If the switch 15 is deemed to be faulty on account of deadbreak it is routed to a bin 28 for rejected switches.

The previously described 20-millisecond timer is a backup device that provides a redundant test. After a switch has been rejected as having a deadbreak, the system reports whether it was rejected on evidence of the Timer Method for detecting deadbreaks or the Limit Switch Method for detecting deadbreaks.

Software in the computer 6 controls the various steps described above for detecting deadbreaks, by means of programming techniques that are known in the art.

Flow Charts, FIGS. 7-11

Figure 7:
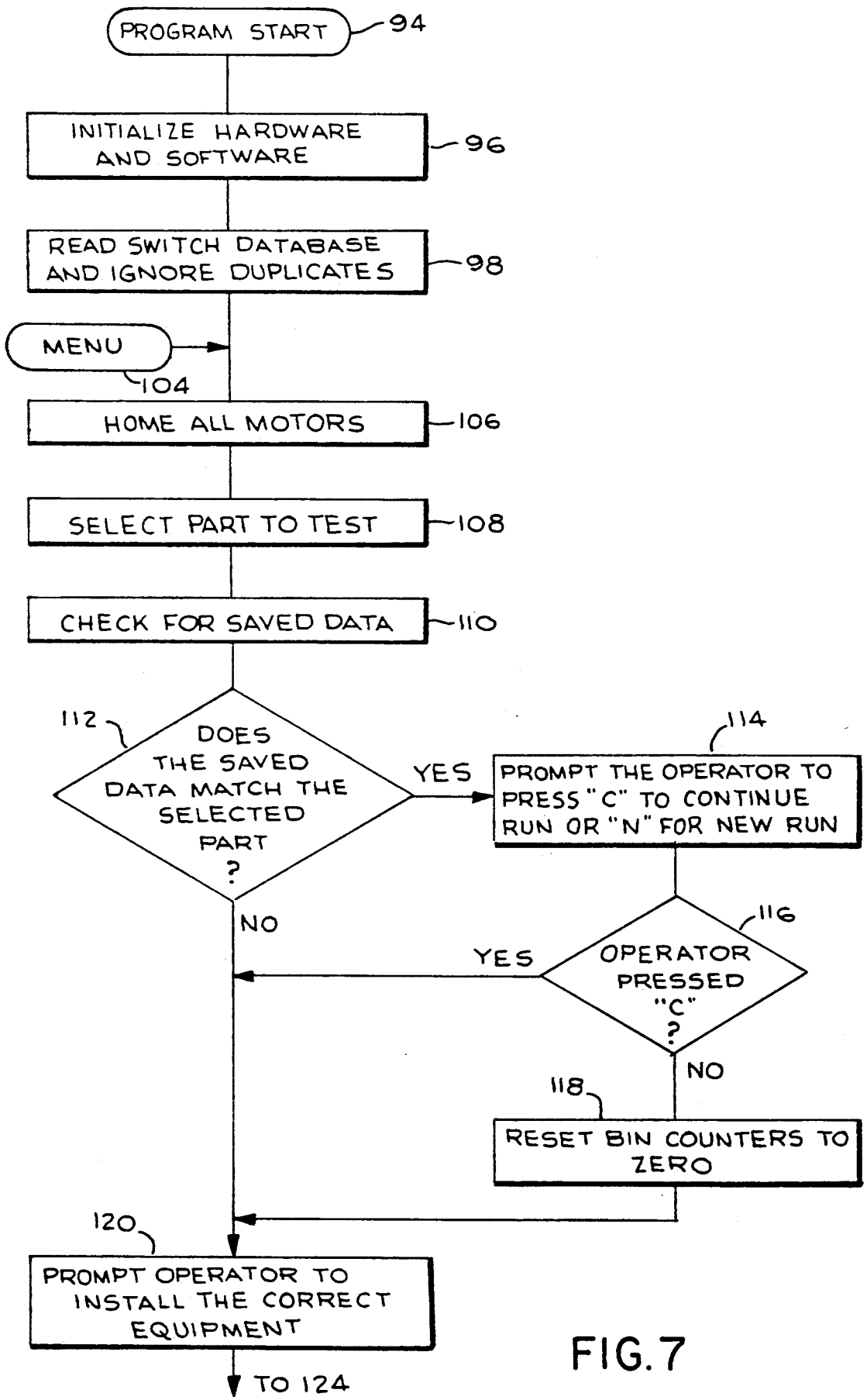
FIGS. 7-11 are sequential portions of a flow chart of software for controlling the test apparatus.

A flow chart of the testing program starts in FIG. 7. After Program Start (94) the hardware and software are initialized (96) and the computer reads the switch database, ignoring duplicates (98). All motors are homed (106), and a menu of part mumbers is displayed. A part to test is selected on (108) and the program is checked for saved data (110). At (112) the saved data is tested against the selected part. If it matches, the operator is prompted (114) to press "C" to continue or "N" for new run. If the operator did not press "C" (116) the bin counters are reset to zero (118).

If the saved data does not match (112) the selected part, the operator is prompted (120) to install the correct equipment. If at (116) the operator did press "C" the operator is prompted (120) to install the correct equipment. At (118) after the bin counters are reset to zero, the operator is prompted (120) to install the correct equipment.

Figure 8:
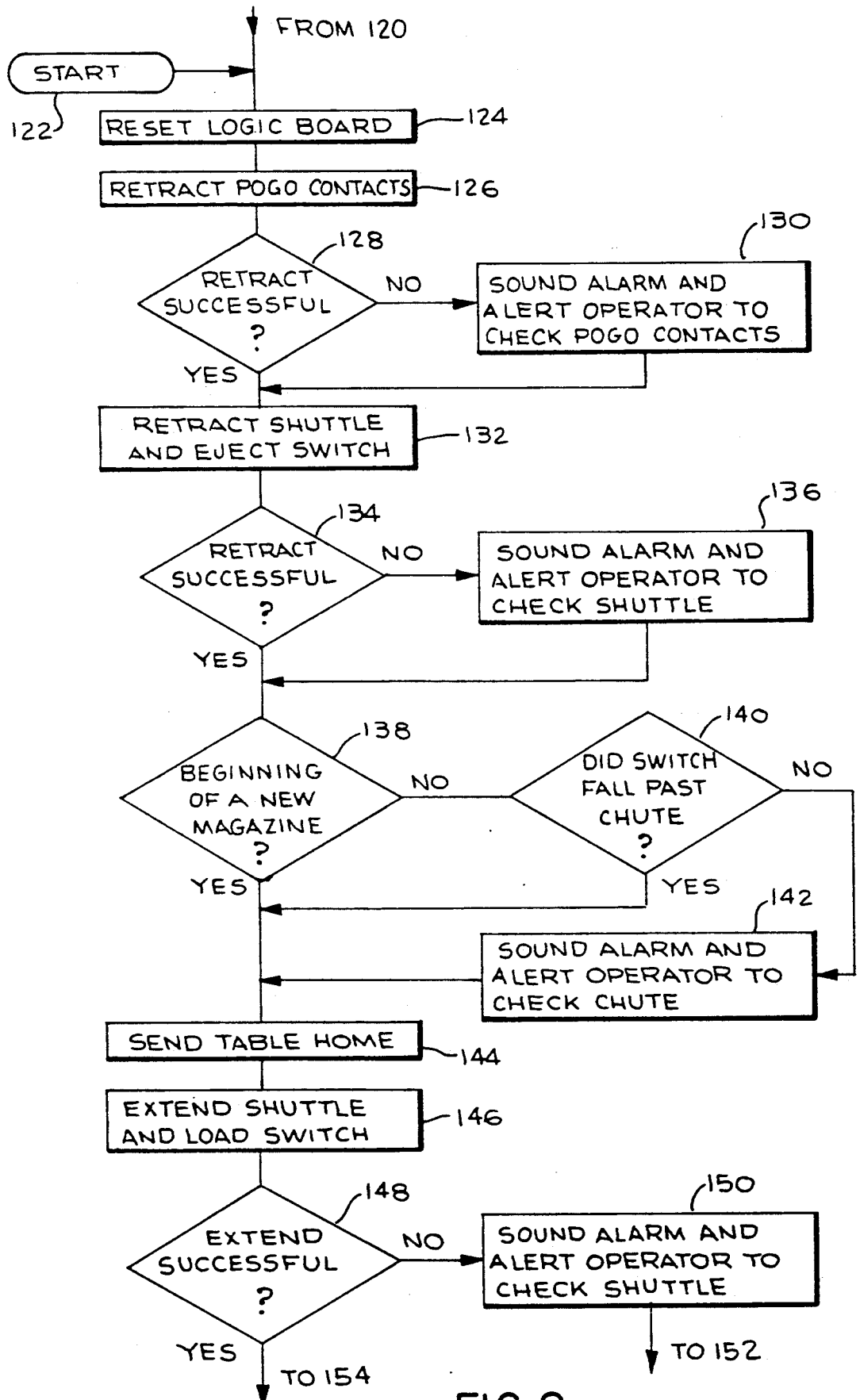

The flow chart continues on FIG. 8 The computer resets the logic board at (124), retracts the pogo contacts (126) and tests whether the retraction was successful (128). If not, an alarm is sounded (130) to alert the operator to check the pogo contacts. If the retraction was successful the shuttle is retracted (132) and the switch is ejected. Again the retraction is tested (134), and if it is not successful the alarm is sounded and the operator is alerted to check the shuttle (136).

If the retraction is successful (134) a test is made as to whether a new magazine is beginning (138). If not, there is a test as to whether the switch fell past the chute (140). If not, the alarm is sounded and the operator is alerted to check the chute (142). If a new magazine was beginning or the switch did fall past the chute, the table is sent home (144). The shuttle is extended and the switch is loaded (146). Thereafter another test is conducted at (148) as to whether the extension of the shuttle was successful. If not, the alarm is sounded and the operator is alerted to check the shuttle at (150).

Figure 9:
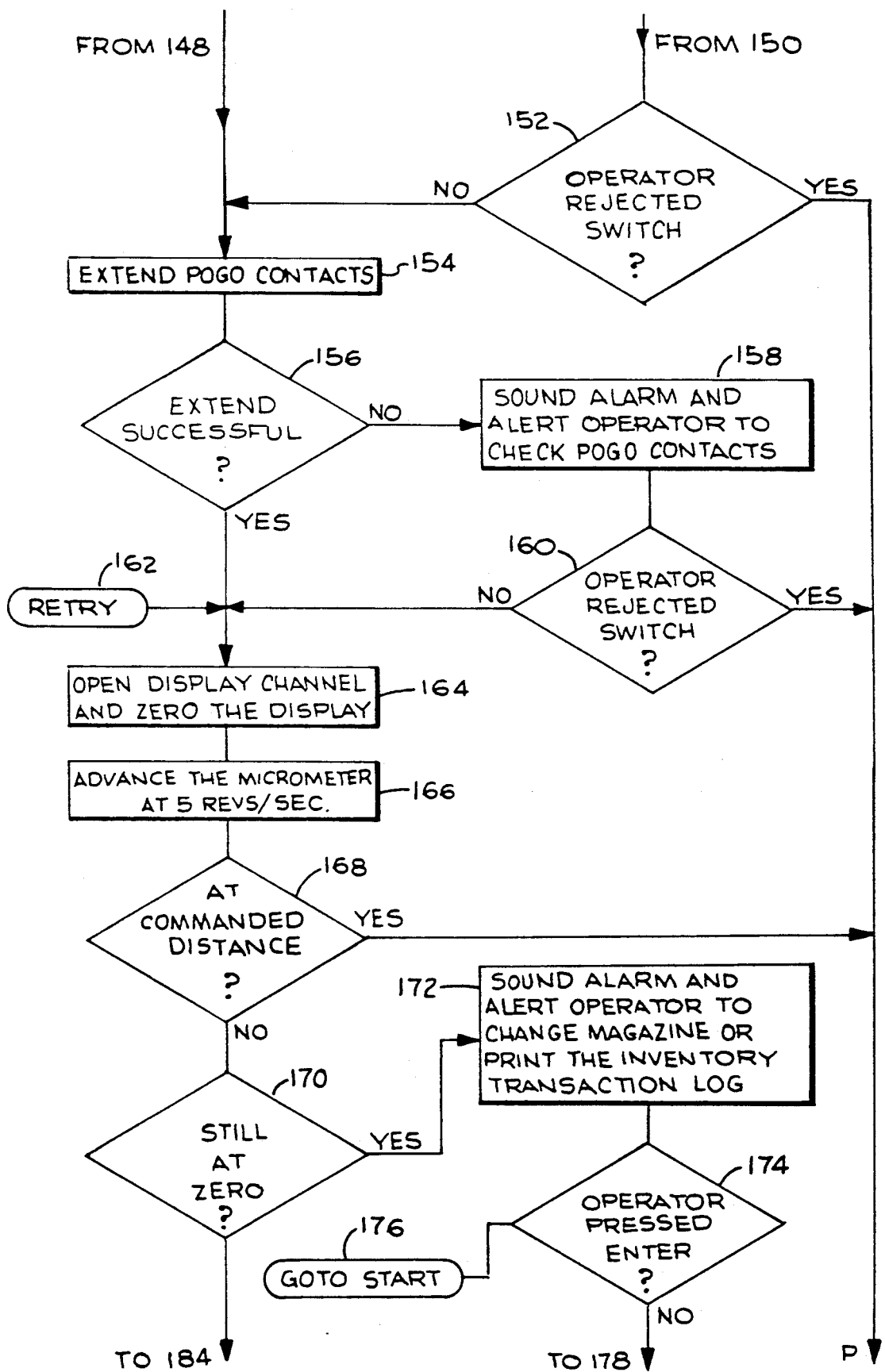

Continuing a description of the flow charts, FIG. 9 shows that if the operator did not reject the switch at (152) after checking (at 150), or if the extension was successful (148), the pogo contacts are extended (154). If the extension is not found to have been successful (156), the alarm is sounded and the operator is alerted to check the pogo contacts (158). After that, if the operator does not reject the switch (160) or if the extension was successful (156), the display channel is opened and the display is zeroed (164).

The micrometer is advanced at 5 revolutions per second (166). It is periodically tested to ascertain whether or not it has traveled the commanded distance (168). If not, and it is still at zero (170), the alarm is sounded and the operator is alerted to change the magazine and press "enter" or print the inventory transaction log by pressing "Q" (174–176). If the operator rejected the switch at 152 or at 160 or the commanded distance was reached at 168 a reject flag is set true, FIG. 11 block 204. If the operator did press "enter" the program branches to label 2 (122).

Figure 10:
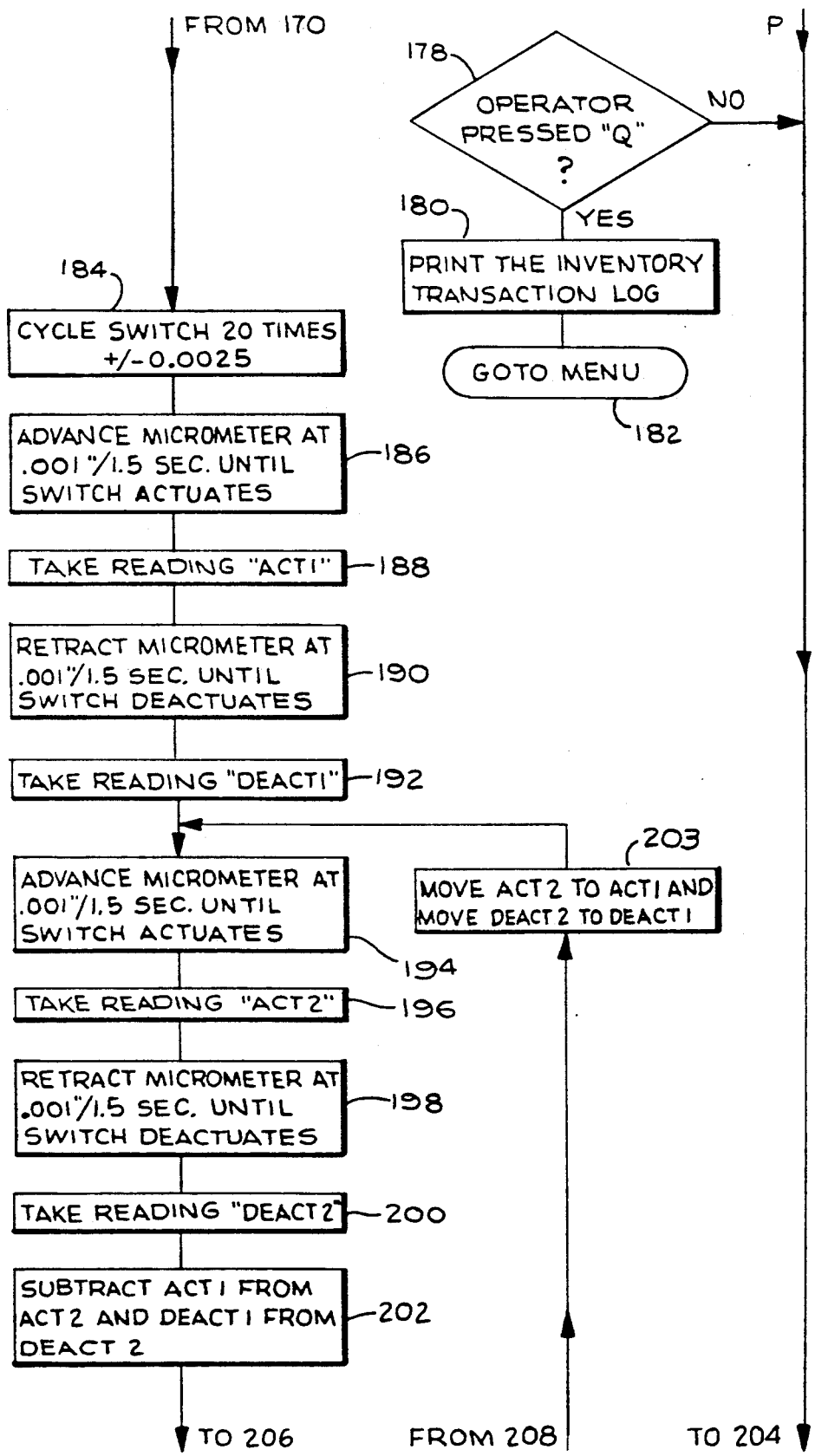

The flow chart continues on FIG. 10. If the operator did not press "enter" at 174, the program queries whether the operator pressed "Q" 178. If not, the reject flag is set true at block 204. If yes at 178, the inventory transaction log is printed (180) and the program branches to label 1 (104).

If the micrometer was not still at zero when tested in block 170, FIG. 9, the switch is cycled 20 times in block 184 of FIG. 10. The micrometer is advanced at 0.001 inch per 1.5 seconds until the switch actuates in block 186 and a reading "ACT 1", meaning first actuation, is taken at 188. If a communication buffer overflow is detected, a reject flag is set true, FIG. 11 block 204. If the deadbreak bit is set true, a reject flag is set true, FIG. 11 block 204. If not the micrometer is retracted at a speed of 0.001 inch per 1.5 seconds (190) until the switch deactuates, and a reading is taken "Deact 1" (192). Once again, the communications buffer is checked for an overflow and the deadbreak bit is tested. If either one is true, a reject flag is set true, FIG. 11 bloc, 204.

If not the micrometer is advanced again until the switch actuates (194). A reading is taken "Act 2" (196). Once again, the communications buffer is checked for an overflow and the deadbreak bit is tested (not shown on FIG. 10). If either one is true, a reject flag is set true, FIG. 11 block, 204. The micrometer is retracted until the switch deactuates (198) and another reading is taken "Deact 2" (200). Once again, the communications buffer is checked for an overflow and the deadbreak bit is tested (not shown on FIG. 10). If either one is true, a reject flag is set true, FIG. 11 block, 204. Thereafter "Act 1" is subtracted from "Act 2" and "Deact 2" is subtracted from "Deact 2" (202).

Figure 11:
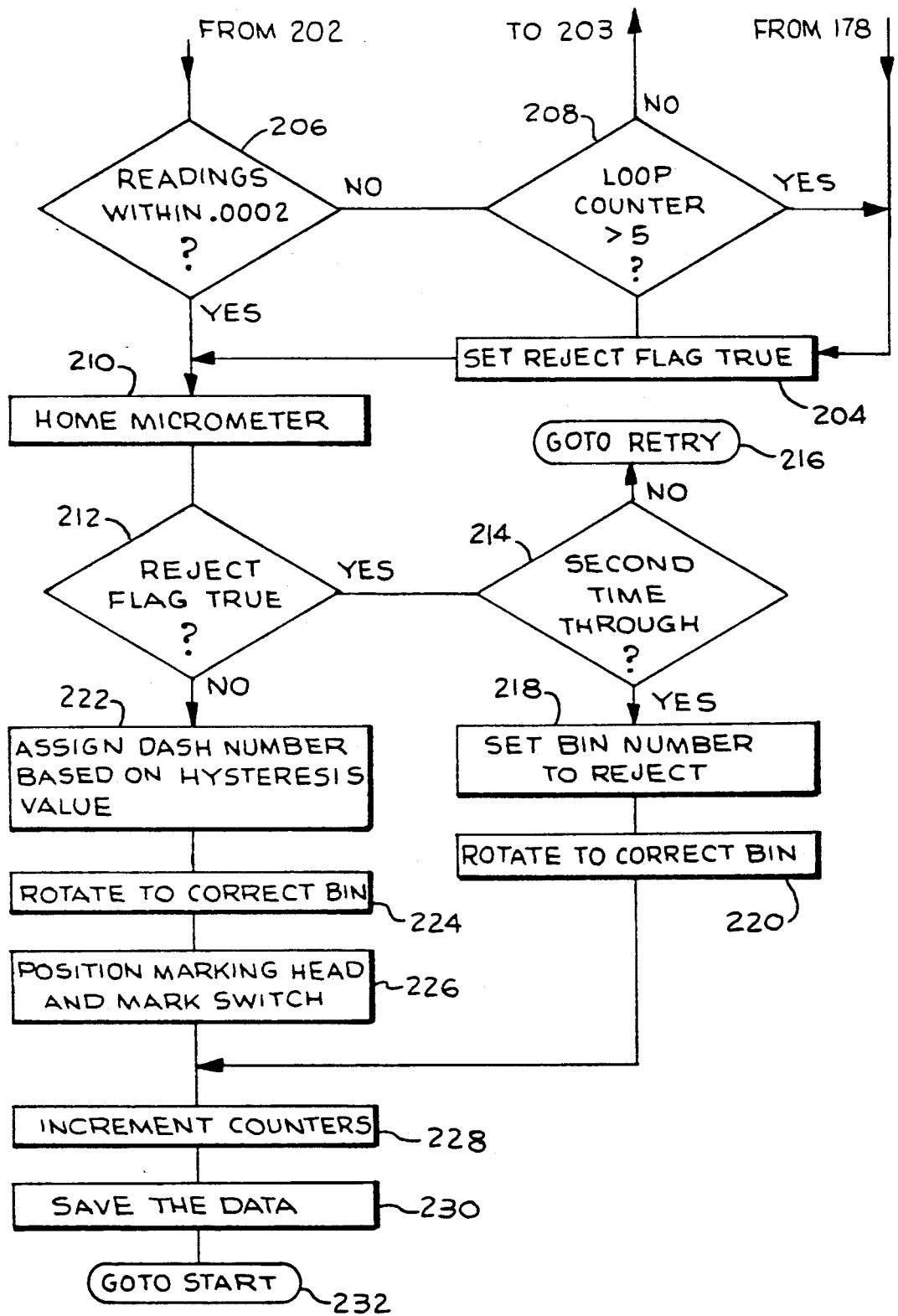

Turning now to FIG. 11, the next step is to test whether or not the readings of the actuation positions are repeatable with 0.0002" of each other and whether or not the deactuation positions are within 0.0002" of each other (206). If not, the Loop Counter (208) tests whether or whether or not more than 5 tries for repeatability have been made and, if not, block 203 of FIG. 10 changes the nomenclature of "Act 2" to "Act 1" and of "Deact 2" to "Deact 1" by moving the corresponding data. The loop then proceeds through block (194) as before. If and when the loop counter (208) finds that more than 5 loops have occurred, the reject flag is set true in block (204).

Returning to block 206, if the readings were within 0.0002" of each other, the micrometer is homed (block 210). Also, if the reject flag is set true (204), the micrometer is homed (210). A test is made as to whether the reject flag (204) is set true (212). If yes, the record is tested as to whether or not it is the second time through (214). If not, block 216, the program branches to label 3, which is at block 162 of FIG. 9. If yes in (214), the bin number is set equal to the reject bin's number (see block 218). The bin table (26) is rotated to the correct bin (220).

If the reject flag is not found (212) to have been set true, a dash number (category number) is assigned based on the value of hysteresis (222). The table is then rotated to the correct bin (224). The marking head is positioned (226) and the switch is marked. The counters are incremented (228), the data is saved (230) and the program goes back to label 2, (232).

End of Testing

When the machine completes the testing of a switch the next switch in the magazine 4 is fed automatically into the test position 16. When all switches of a run have been tested, the computer 6 and printer 7 may optionally provide end-of-run test data and stock-control data relating to quantities of switches, including the quantity of switches placed in each bin and data regarding quality assurance.

Other Embodiments

The invention has been illustrated by describing one preferred embodiment, as required. Many other embodiments and variations utilizing the invention are possible and protected to the extent that they are within the scope of the claims.

We claim:

1. A method for testing a double-throw switch (15) having a normally closed contact (36), a common contact (52), a normally open contact (50), and an actuator member (38) to detect, by a redundant technique, a slow transit time of the common contact in moving from the normally closed contact to the normally open contact, comprising the steps of:

driving the actuator of the switch inward by drive apparatus (10, 18) at least until the normally closed contact opens;

detecting the opening of the normally closed contact and thereupon providing a first signal (36, 58);

starting a first timer (84) upon occurrence of said first signal to define a first predetermined time interval;

thereafter, detecting the closing of the normally open contact and thereupon providing a second signal (50, 58);

sending a command to the drive apparatus to operate in an outward direction only if said second signal occurs during said first time interval and not if said second signal occurs after said first time interval (85, 58);

also, upon occurrence of said first signal, stopping said drive apparatus and starting another timing procedure (6) for defining a second time interval;

operating said drive apparatus in said outward direction if and only if said second signal occurs during said second time interval;

blocking operation of said drive apparatus in said outward direction if said second signal occurs after expiration of either or both of said time intervals, thereby identifying that said switch has slow transit time.

* * * * *